(12) United States Patent
Arsovski et al.

(10) Patent No.: US 9,172,371 B2
(45) Date of Patent: Oct. 27, 2015

(54) MAJORITY DOMINANT POWER SCHEME FOR REPEATED STRUCTURES AND STRUCTURES THEREOF

(71) Applicant: INTERNATIONAL BUSINESS MACHINES CORPORATION, Armonk, NY (US)

(72) Inventors: Igor Arsovski, Williston, VT (US); Robert M. Houle, Williston, VT (US)

(73) Assignee: GLOBALFOUNDRIES U.S. 2 LLC, Hopewell Junction, NY (US)

( * ) Notice: Subject to any disclaimer, the term of this patent is extended or adjusted under 35 U.S.C. 154(b) by 99 days.

(21) Appl. No.: 13/948,567

(22) Filed: Jul. 23, 2013

(65) Prior Publication Data
US 2013/0307580 A1 Nov. 21, 2013

Related U.S. Application Data

(63) Continuation of application No. 13/414,976, filed on Mar. 8, 2012, now Pat. No. 8,525,546.

(51) Int. Cl.
*G11C 5/14* (2006.01)
*H03K 19/00* (2006.01)
*H01L 25/00* (2006.01)
*H03K 19/003* (2006.01)
*G11C 11/419* (2006.01)

(52) U.S. Cl.
CPC ............ *H03K 19/003* (2013.01); *G11C 11/419* (2013.01)

(58) Field of Classification Search
CPC ........... G11C 5/14; H03K 19/00; H01L 25/00
USPC ............ 326/16, 38–41, 46, 47; 365/200, 201, 365/227, 189.02
See application file for complete search history.

(56) References Cited

U.S. PATENT DOCUMENTS

| | | |
|---|---|---|
| 5,923,512 A | 7/1999 | Brownlow et al. |
| 6,496,972 B1 | 12/2002 | Segal |
| 6,944,843 B2 | 9/2005 | Bansal |
| 7,370,294 B1 | 5/2008 | Rahman |
| 7,549,139 B1 | 6/2009 | Tuan et al. |
| 7,613,050 B2 | 11/2009 | Braceras et al. |
| 7,643,366 B2 | 1/2010 | Nakamura et al. |
| 7,861,190 B1 | 12/2010 | Kretchmer et al. |
| 7,903,483 B2 | 3/2011 | Russell et al. |
| 7,987,442 B2 | 7/2011 | Rajski et al. |
| 8,624,626 B2 * | 1/2014 | Chi .................................. 326/37 |
| 2001/0039640 A1 | 11/2001 | Bernstein et al. |

(Continued)

OTHER PUBLICATIONS

A. K. Singh et al., "Mitigation of Intra-Array SRAM Variability using Adaptive Voltage Architecture", ICCAD09, Nov. 2-5, 2009, 8 pages.

(Continued)

*Primary Examiner* — Daniel D Chang
(74) *Attorney, Agent, or Firm* — David Cain; Roberts Mlotkowski Safran & Cole, P.C.

(57) ABSTRACT

Methods and structures for configuring an integrated circuit including repeated cells that are divided into banks having a respective power assist and a respective operational assist are provided. A method includes configuring the banks without power assist and operational assist. The method further includes selecting the power assist for a bank based on a determination that a weak cell remains in the bank after configuring the bank with the respective operational assist.

20 Claims, 10 Drawing Sheets

(56) References Cited

U.S. PATENT DOCUMENTS

| | | | |
|---|---|---|---|
| 2010/0085825 A1* | 4/2010 | Keeth et al. | 365/200 |
| 2010/0128541 A1 | 5/2010 | Russell et al. | |
| 2010/0277990 A1 | 11/2010 | Kenkare et al. | |
| 2010/0281448 A1 | 11/2010 | He | |
| 2011/0110065 A1* | 5/2011 | Foster et al. | 361/803 |
| 2013/0106463 A1* | 5/2013 | Chi | 326/39 |

OTHER PUBLICATIONS

Arsovski, I. et al., "A 64Mb SRAM in 32nm High-k Metal-Gate SOI Technology with 0.7V Operation Enabled by Stability, Write-ability and Read-ability Enhancements", IEEE International Solid-State Circuits Conference, Feb. 2011, pp. 1-20.

\* cited by examiner

FIG. 2

BANKSIZE IN CELLS

| Sigma Value | 1K / 1024 | 10K / 10240 | 32K / 32768 | 64K / 65536 |
|---|---|---|---|---|
| 3.5 | 0.788 | 0.092 | 0 | 0 |
| 4 | 0.968 | 0.723 | 0.354 | 0.125 |
| 4.5 | 0.997 | 0.966 | (0.895) | 0.8 |
| 5 | 0.9997 | 0.997 | 0.991 | 0.981 |
| 5.5 | 0.9999 | 0.9999 | 0.9993 | 0.999 |
| 6 | 0.9999 | 0.9999 | 0.9999 | 0.9999 |

FIG. 3

BANKSIZE IN CELLS

| Sigma Value | 1K / 1024 | 10K / 10240 | 32K / 32768 | 64K / 65536 | 128K / 131072 |
|---|---|---|---|---|---|
| 1 | 0 | 0 | 0 | 0 | 0 |
| 2 | 0 | 0 | 0 | 0 | 0 |
| 3 | 0.25 | 0 | 0 | 0 | 0 |
| 3.5 | 0.788 | 0.092 | 0 | 0 | 0 |
| 4 | 0.968 | (0.723) | 0.354 | 0.125 | 0.016 |
| 4.5 | 0.997 | 0.966 | (0.895) | 0.8 | 0.641 |
| 5 | 0.9997 | 0.997 | 0.991 | 0.981 | 0.963 |
| 5.5 | 0.9999 | 0.9999 | 0.9993 | 0.999 | 0.998 |

| Bank ID 301 | Power Assist 302 | Wake-Up Assist 303 | Bias Assist 304 | Read Assist 305 | Write Assist 306 | Stability Assist 307 |
|---|---|---|---|---|---|---|
| 205A | 00 | 1 | 1 | 0 | 0 | 0 |
| 205B | 00 | 0 | 0 | 1 | 0 | 0 |
| 205C | 11 | 0 | 1 | 0 | 0 | 0 |
| ... | ... | ... | ... | ... | ... | ... |
| 205N | 00 | 0 | 1 | 0 | 0 | 1 |

FIG.9

MAJORITY DOMINANT POWER SCHEME FOR REPEATED STRUCTURES AND STRUCTURES THEREOF

FIELD OF THE INVENTION

The invention relates to integrated circuits and, more particularly, to a method of reducing power consumption in repeated integrated circuit structures and structures thereof.

BACKGROUND

Moore's law predicts that the number of transistors that can be placed on an integrated circuit (IC) is doubled approximately every two years. However, as the number of transistors increases and their size decreases, the variation in their characteristics and the probability for defects increases proportionally. For example, in nanometer-scale manufacturing processes, slight variations in the structure of a transistor can produce substantial differences in its operation with respect to other instances of the same transistor in the IC. Thus, ICs having large numbers of repeated structures, such as cells in static random access memories (SRAMS), may have defects due to manufacturing variations. These defects may impact the performance and manufacturing yield of ICs.

Repeated structures used in integrated circuits ("ICs") may be logic elements (hereinafter referred to as "cells"), such as memory elements and gate arrays, for example. Current IC design methods assume that all cells in a repeated structure IC have the same probability of failure. For example, static random access memory (SRAM) devices, dynamic random access memory (DRAM) and phase change memory (PCM) devices may include billions of memory cells. While each instance of a cell generally has the same design, manufacturing variations may cause some of the cells to be weaker than others. That is, a weaker cell may have operational characteristics significantly below a nominal reliability parameter. For example, a weaker memory cell may have an error rate for one or more it operational characteristics (i.e., readability, writability, and stability) that is significantly above an expected (e.g., average) error rate.

The probability that a particular cell differs from the manufacturing average cell can be measured by a sigma value (x). For example, in a million cell SRAM, one would expect to find approximately 1350 cells that exhibit 3-sigma (or worse) stability properties, but only 32 cells that would exhibit 4-sigma or worse stability properties. In current technology, most SRAMs are designed to tolerate approximately 3 failing cells out of 10 million (i.e. 5-sigma), where the failing mechanism can be due to hard failures (manufacturing defects), or due to soft failures (readability, stability or writability malfunctions) all of which are voltage, temperature and process dependent. Usually increasing the voltage improves the readability, stability and writability of these weak cells, but doing so, greatly increases the overall power consumption and makes it harder (and more expensive) to maintain the temperature within design limits.

To guard against failures in weak cells, current IC designs are configured to operate using assist measures, such as higher operating voltage and/or slower speed. For example, the current design practice for SRAMs is to treat all cells as if they are 5.2-sigma weak for readability, writability, and stability. As a result, 99.9999% of the cells in an SRAM can be overdesigned, which consumes more power and performs at a slower speed. Further, 88% of memory banks will not see an SRAM cell that is worse than 4.5-sigma even in the worst case.

Because a vast majority of the SRAM cells are robust and can be expected to reliably operate without the assist measures (e.g., power assist, readability assist, writability assist, and/or stability assist), the performance (e.g., power consumption and/or speed) of the IC is unnecessarily limited by providing such measures to robust cells. Accordingly, there exists a need in the art to overcome the deficiencies and limitations described hereinabove.

SUMMARY

In aspects of the invention, a method configuring an IC including repeated cells divided into a plurality of banks, each of the plurality of banks having a respective power assist and a respective operational assist. The method comprises configuring a first of the plurality of banks without the respective power assist and the respective operational assist. The method further comprises selecting the power assist of the first bank based on a determination that a weak cell remains in the first bank after configuring the first bank with the respective operational assist.

In additional aspects of the invention, a method configures an IC including a plurality of repeated cells. The method comprises determining a first weakness in a first of a plurality of banks of the repeated cells. The method further comprises selecting an operational assist of the first bank based on the first weakness. The method further comprises determining a second weakness in the first bank configured with the selected first operational assist. The method further comprises selecting a first power assist of the first bank based on the second weakness.

In additional aspects of the invention, a method configures an IC including a plurality of repeated cells. The method comprises selecting a first power-saving assist of the first bank based on determining that a first of a plurality of banks of the repeated cells is robust.

In further aspects of the invention, a computer program product comprises a computer usable storage medium having a computer readable program stored in the medium, wherein the computer readable program, when executed on a computing device, is operable to cause the computing device to configure a repeated structure integrated circuit without an operational assist and without a power assist. Further, the computer readable program is operable to cause the computing device to select a first of a plurality of power assists corresponding to a first of a plurality of banks of the repeated structure integrated circuit, the selecting being based on a determination that at least one weak cell remains in the first bank after selecting a first of the plurality of operational assists for the first bank.

In still further aspects of the invention, a repeated structure integrated circuit comprises a plurality of banks of cells. The a repeated structure integrated circuit further comprises assist logic corresponding to the plurality of banks, the assist logic including a plurality of power assists and a plurality of operational assists. The repeated structure integrated circuit further comprises tuning logic configured to select a first of the plurality of power assists corresponding to a first of the plurality of banks based on a determination that the first bank includes a weak cell when the first bank is configured with a first of the plurality of operational assist measures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 2 and 3 show data from an exemplary analysis of repeated structure integrated circuits in accordance with aspects of the invention;

FIG. 9 shows an exemplary data structure including configuration information in accordance with aspects of the invention;

DETAILED DESCRIPTION

The invention relates to integrated circuits and, more particularly, a method of reducing power consumption in repeated integrated circuit structures and structures thereof. According to aspects of the invention, the repeated integrated structures can be divided into groups that minimize the probability that any one of the groups will include a weak cell that is likely to fail. The integrated circuit can be iteratively tested and the groups can be individually tuned to provide one or more operational assist measures to groups that include a weak cell. Further, groups identified as robust by the testing can be tuned with power-savings assist measures.

More specifically, in accordance with aspects of the invention, repeated integrated circuit structures are divided into banks (i.e., groups) that are individually tunable (i.e., configurable). In this way, it is possible for each of the banks to use one or more assist measures based on types of failures determined for the cells in respective banks. As such, it is possible to use finer granularity in setting assist measures to improve power performance for the entire IC, and also improve manufacture yields of ICs. For example, in embodiments, at least one bank includes robust cells (e.g., less than 4.5-sigma cells) that are tuned to function without any type of operational assist measure, while at least one other bank includes weak cells (e.g., greater than 4.5-sigma cells) that are tuned using one or more types of assist measure (e.g., power assist, read assist, write assist, and/or stability assist). Thus, greater performance can be achieved in the IC by selectively providing power and/or operational assists only to those banks that include weak cells. Additionally, greater performance can be achieved by providing power-savings assist to banks entirely comprised of robust cells.

In aspects of the invention, banks within a repeated structure IC can be configured to be powered though either the higher voltage source or the lower voltage source. The banks' sizes can be defined to maximize the number of banks that are functional at the lower voltage to optimize the performance of the majority of the banks. Each of the banks can have a respective likelihood of failure at the lower voltage and at the higher voltage. A bank that is functional at the lower voltage consumes less power; whereas, a bank that is not functional at the lower voltage but is functional at the higher voltage can be connected to the higher voltage. Thus, the IC's performance can be improved by selectively connecting each bank that is not functional at the lower voltage to the higher voltage.

Figure 1:
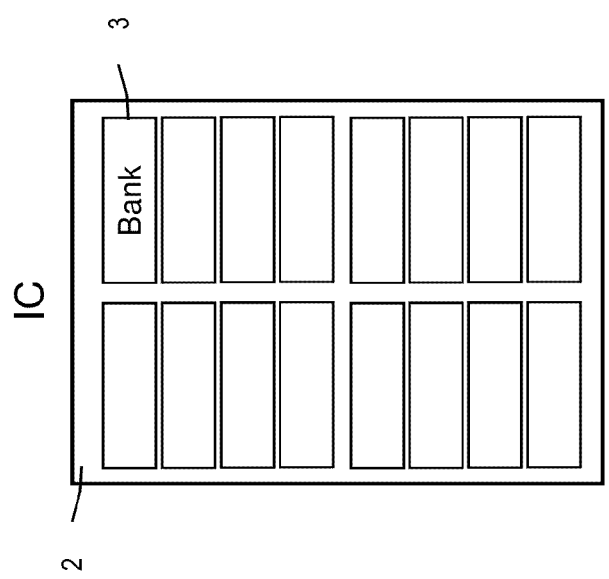
FIG. 1 shows an illustrative repeated structure integrated circuit in accordance with aspects of the invention.

FIG. 1 shows an exemplary IC 2 with repeated structures divided into banks, for example, bank 3, that are individually tunable. For example, the IC 2 may be a 512 KB SRAM having memory cells divided into 32 KB banks. As discussed above, a particular bank can have a likelihood of failure in one or more operational aspect, including readability, writability, and stability, in which the likelihood of a cell's failure for each operational aspects characterized by a sigma-value. Further, the cell's sigma value can be attributed to the bank in which the cell resides for the purposes of tuning the bank. For example, if bank 3 includes a cell that is 6.0-sigma weak for readability, then bank 3 may also be referred to as 6.0-sigma weak for readability and all the cells in the bank 3 can be tuned accordingly.

FIG. 2 shows data from an exemplary analysis of the IC 2 that compares different bank sizes (in cells) with corresponding sigma-values. Table 4 in FIG. 2 illustrates that the probability that all cells in a bank have a likelihood of failure (i.e., sigma-value) is related to the bank's size. The probability that all cells in bank have a sigma-value better than a particular value can be determined using the following equation:

$$\text{Probability that all cells in bank are better than } X \text{ sigma} = (1-p)^g, \quad (1)$$

where:
p=probability a cell is worse than X sigma; and
g=bank size in cells.

As shown in FIG. 2, the probability of all the cells in a 32 KB bank being 4.5-sigma or better is 89.5% As such, by dividing the cell of the SRAM into 32 KB banks and designing the IC 2 to operate with a probability of failure of 4.5-sigma, 89.5% of the cells are expected to function without any operational assist (e.g., readability, writability, stability) and thereby improving an individual IC's performance while improving overall IC production yields. In the event that a particular bank is weak (e.g., greater than 4.5-sigma weak for an operational characteristic), it can be tuned to used one or more operational assist measures and/or power assist measures to render the bank robust (e.g., less than 4.5-sigma weak).

FIG. 3 shows data for another exemplary analysis of the IC 2 that compares different bank sizes (in cells) with corresponding sigma-values for the different bank sizes. Table 5 in FIG. 3 illustrates the IC 2 as a 512 Kb SRAM, wherein the banks of the SRAM may be selectively connected to either a lower supply voltage or a higher supply voltage. If the SRAM is divided into banks having 10K bits, then 72.3% of the groups could operate at the lower supply voltage sufficient for a 4.0-sigma cell (rather than the current practice in which 100% of the cells are configured to operate at a higher voltage sufficient of a 5.2-sigma cell). In comparison, if the IC 2 is divided into 16 banks of 32K bits, than 89.5% of the groups would only require lower supply voltage high enough to protect a 4.5-sigma cell. As such, in the second case, when the banks are 32 KB, the present invention maximizes an expected number of banks that can operate at the lower voltage source (i.e., without any power assist). The remaining 10.5% of the cells may be tuned to operate with operational and/or power assist. For example, the banks including the less than 4.5-sigma cells may be tuned to operate at the higher supply voltage.

Figure 4:
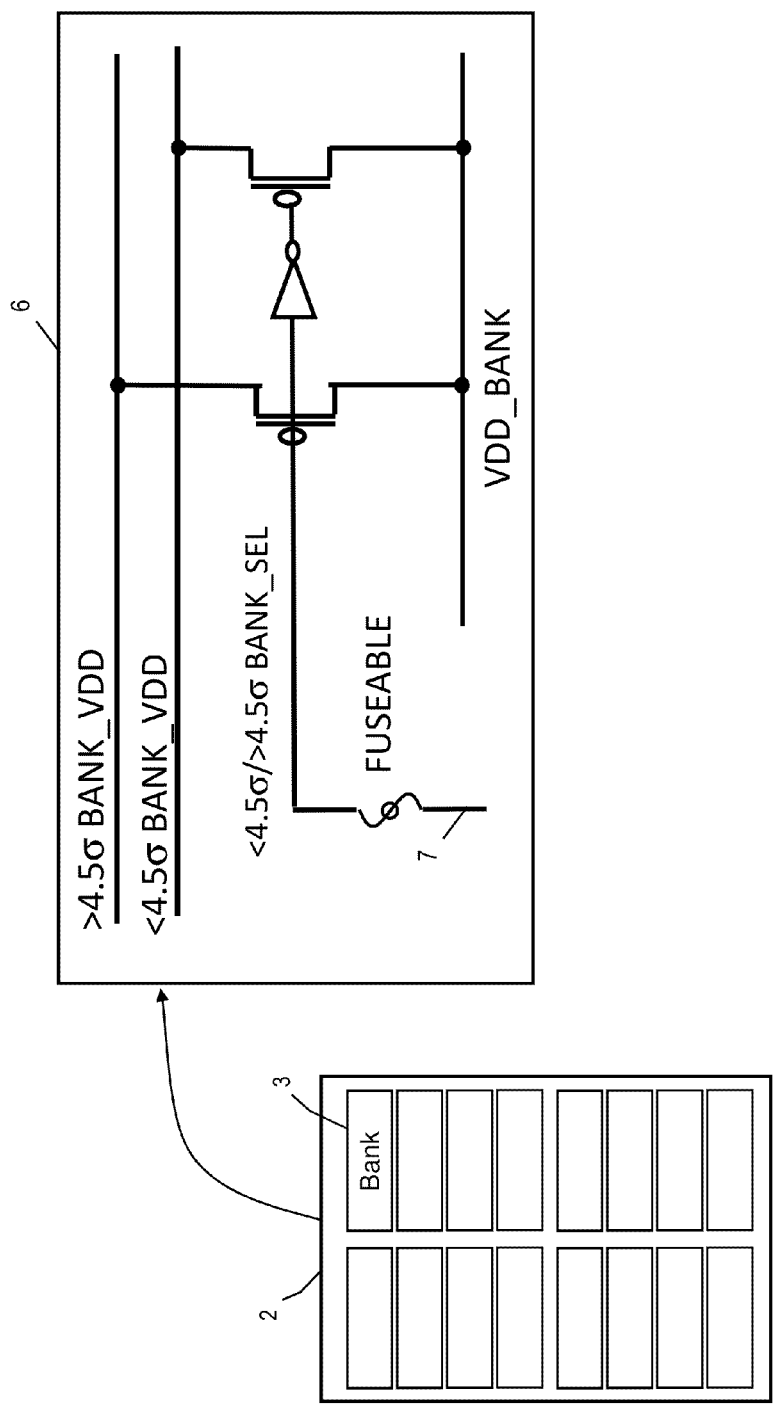
FIGS. 4 and 5 show illustrative power assist logic that can be used in a repeated structure integrated circuit in accordance with aspects of the invention.

FIG. 4 shows exemplary power assist logic 6 that can be used in IC 2 in accordance with aspects of the invention. Using the exemplary assist logic 6, each bank (e.g., bank 3) can be selectively connected to one of two different voltage sources based on the bank's likelihood of failure to provide a power assist that can repair operational failures. For example, if bank 3 is greater than 4.5-sigma weak (i.e., has a greater likelihood of failure than a 4.5-sigma threshold) for an operational characteristic, the bank may be connected to the higher one of the voltage sources (e.g., >4.5-sigma BANK_VDD) based on a fusible select line 7. On the other hand, if the bank is less than 4.5-sigma weak (i.e., has a lower likelihood of failure than a 4.5-sigma threshold) for one of the operational characteristics, then the bank may be connected to the lower one of the voltage sources (e.g., <4.5-sigma BANK_VDD) based on the fusible select line 7. By supplying the higher voltage only to the banks of IC 2 with weak cells (i.e., >4.5 sigma), it is now possible to substantially reduce power consumption in the IC.

Figure 5:
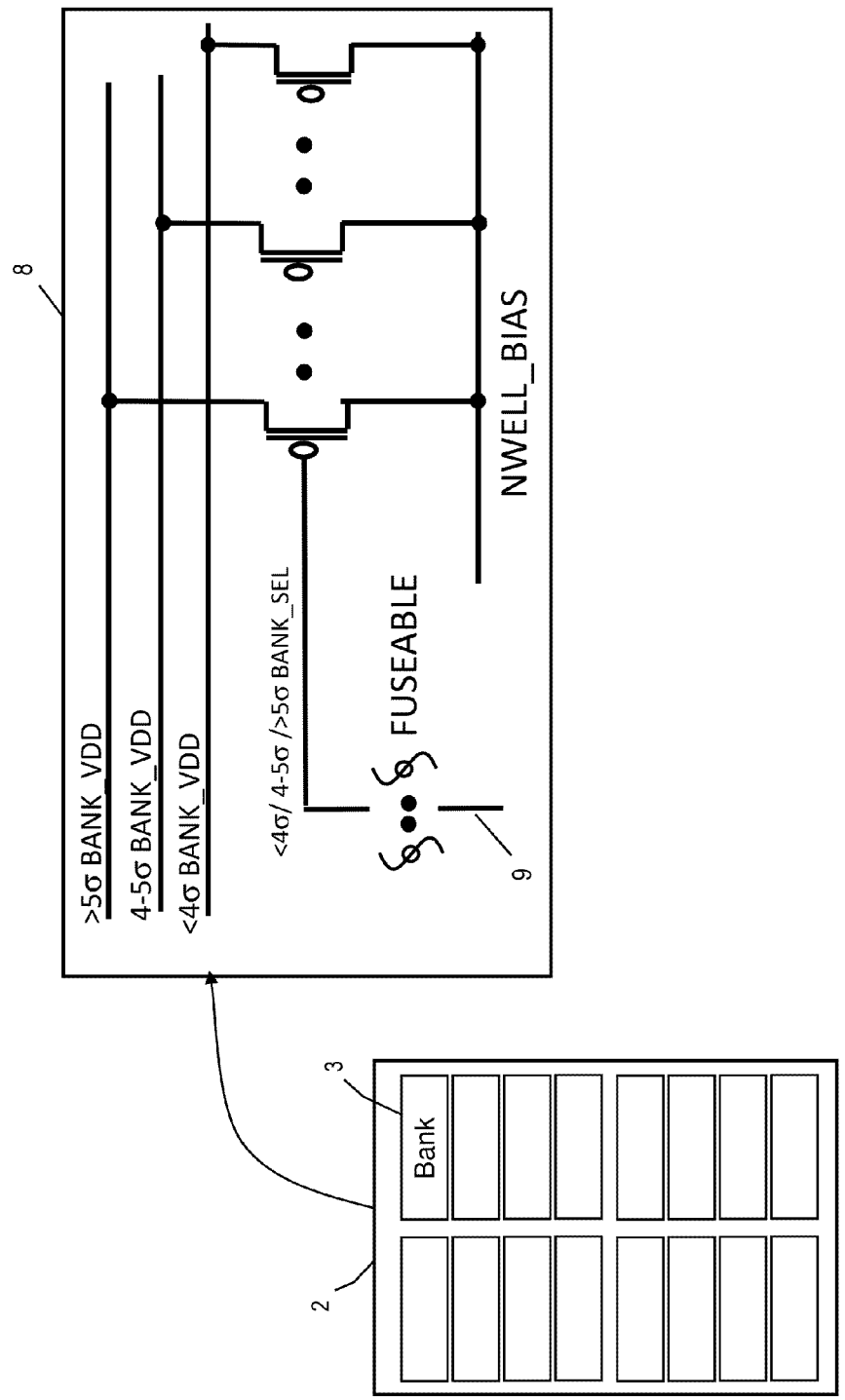

FIG. 5 shows exemplary power assist logic 8 that can be used in the IC 2, in accordance with aspects of the invention. In this example, each bank of the IC can be selectively connected to one of three different voltage sources to provide a type of stability assist for the SRAM cell though modulating the strength of the SRAM cell PFETs. More specifically, each bank may be connected to either a >4.5-sigma BANK_VDD, a 4.0-5.0-sigma BANK_VDD or a <4.5-sigma BANK_VDD based on a fusible select line 9.

While FIGS. 4 and 5 show the banks of IC 2 connected to either two or three voltage sources corresponding to two or three sigma-value ranges, the present invention contemplates that other embodiments may use greater numbers of voltage sources corresponding to different sigma-value ranges. Further, while FIGS. 4 and 5 show the banks being connected different to VDD voltages, embodiments may connect the banks to different VCS voltages. Further, in embodiments, multiple voltage domains can be supported by the present invention. That is, different elements of a device may be powered by a different, tunable source. For example, a SRAM may include a separate voltage supply (e.g., VCS) that only powers the actual memory cells and the word line drivers but not all the other peripheral circuitry required for actual SRAM operability.

Figure 6:
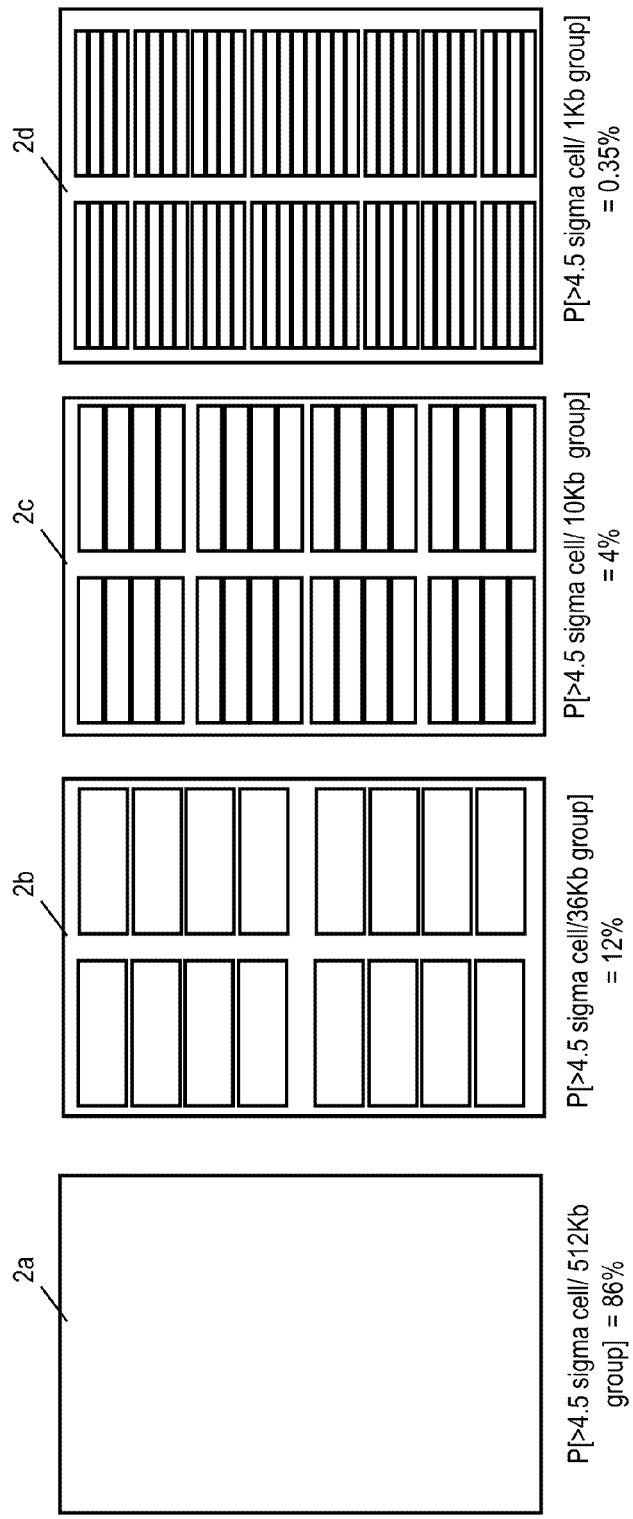
FIG. 6 shows illustrative repeated structure integrated circuits in accordance with aspects of the invention.

FIG. 6 illustrates exemplary divisions of an IC, in accordance with aspects of the present invention. For example, IC 2a shows an undivided 512 KB SRAM having a single 512 KB bank, in which there is an 86% chance that this block will contain a 4.5-sigma or weaker cell. IC 2b shows a 512 KB SRAM divided into 32 KB banks, in which there is a 12% chance that a block will contain a 4.5-sigma or weaker cell. IC 2c shows a 512 KB SRAM divided into 10 KB banks, in which there is only a 4% chance that a block will have a 4.5-sigma or weaker cells. IC 2d shows a 512 KB SRAM divided into 1 KB banks, in which there is only a 0.35% chance that a block will contain a 4.5-sigma or weaker cell. Thus, smaller banks can yield better power savings in an IC. While FIG. 6 is described in terms of an SRAM, embodiments of the present invention could be applied to other repeated structures, such as logic. Further smaller banks could be used with more efficient fuses (e.g., Phase Change Memory) to further improve the power-reduction granularity.

System Environment

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable mediums having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 7:
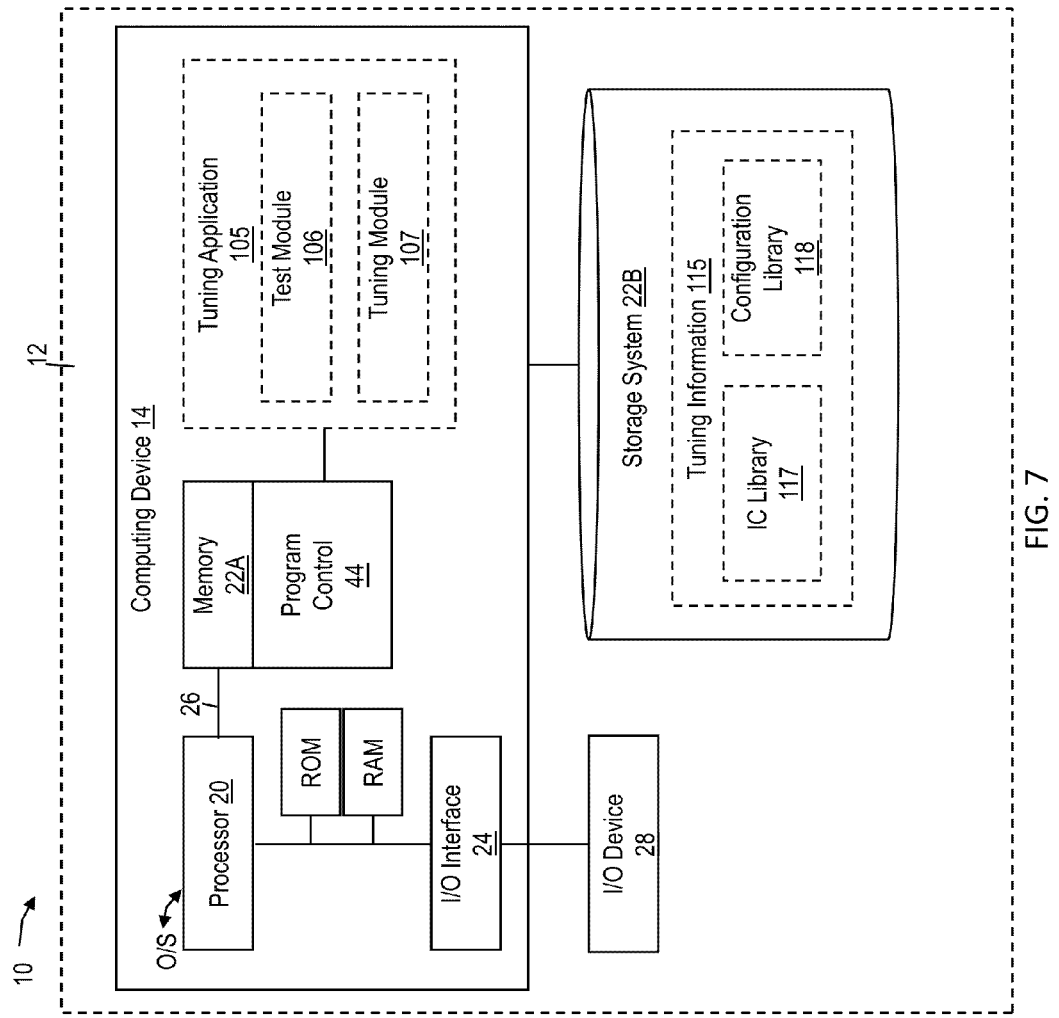
FIG. 7 shows an illustrative system for implementing designs and steps in accordance with aspects of the invention.

FIG. 7 is an exemplary system 10 for implementing the steps in accordance with aspects of the invention and structures thereof. The system 10 can be a test system or test tool configured to test and/or tune ICs after their manufacture. To this extent, the system 10 may be connected to a server or other computing infrastructure 12 that can perform the processes described herein. In particular, the computer infrastructure 12 includes a computing device 14. The computing device 14 can be resident on a network infrastructure or computing device of a third party service provider (any of which is generally represented in FIG. 7).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with an external I/O device 28 and a storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, PDA, handset, keyboard etc. Further, the I/O device 28 can comprise any device the interfaces with ICs. For instance, the I/O device may communicate with an IC to test and tune the IC in accordance with aspects of the present invention. Additionally or alternatively, the I/O device may trigger the IC to perform a built-in self test that tests and tunes the IC in accordance with aspects of the present invention. Moreover, the I/O device 28 can provide power to the IC under test.

In general, the processor 20 executes computer program code (e.g., program control 44), which can be stored in the memory 22A and/or storage system 22B. Moreover, in accordance with aspects of the invention, the program control 44 includes tuning application 105 that performs one or more of the processes described herein. The tuning application 105 can be implemented as one or more sets of program code in the program control 44 stored in memory 22A or as separate or combined modules. Additionally, the tuning application 105 may be implemented as separate dedicated processors or a single or several processors to provide the function of these tools.

While executing the computer program code, the processor 20 can read and/or write data to/from the memory 22A, the storage system 22B, and/or the I/O interface 24. The program code executes the processes of the invention, for example, the tuning application 105. Further, data read and/or write data to/from the memory 22A, the storage system 22B and/or the I/O interface 24 may include tuning information 115. The bus 26 provides a communication link between each of the components in the device 14.

In accordance with aspects of the invention, the tuning application 105 is computer program code stored in, for example, memory 22A and/or storage system 22B that, when executed by the processor 20, causes the computing device 14 to tune ICs to repair defects, improve robustness, and/or increase production yields. In embodiments, for example, the tuning application 105 determines errors in ICs having repeated structures. Further, based on the determined errors, the tuning application 105 can iteratively tune the ICs' respective assist logic on a per-bank basis.

The tuning application 105 may include software and/or hardware modules for tuning ICs. In embodiments, the computing device 14 may be part of a test bench system that executes the tuning application 105 to tune the operation of an IC before it is fielded. For example, the tuning application 105 may be used to tune newly manufactured ICs. In other embodiments, the computing device 14 may be a system that tunes an IC after it has been fielded. For example, the tuning application may be used to reconfigure an IC installed in a personal computer or other computing device. To this extent, the tuning application 105 may be executed by a local processor directly linked to the IC via, for example, a personal computing device or a tuning tool, or the tuning application 105 may be executed by a remote processor linked to the IC via for example, the personal computing device or the tuning tool.

According to aspects of the invention, the tuning application 105 includes a test module 106 and a tuning module 107. As shown, modules 106 and 107 can be separate modules within the tuning application 105. In embodiments, the functionality of modules 106 and 107 may also be integrated within the tuning application 105, which are implemented as one or more dedicated special-use processors. Alternatively, one or more of modules 106 and 107 may be provided as a separate application from the tuning application 105. Further some or all of the functions of modules 106 and 107 may be incorporated within the ICs. For example, the functions of test module 106 and tuning module 107 may be included in a built-in self-test (BIST) controller. In such case, the tuning application 105 may provide a software interface that causes the computing device 14 to communicate with an IC (e.g., via I/O device 28) that includes the BIST controller.

The tuning application 105 may tune ICs based on tuning information 115 stored in storage system 22B (and/or memory 22A). In embodiments, the tuning information 115 includes an IC library 117 and a configuration library 118. According to aspects of the invention, the IC library 117 may be a repository of information corresponding to different types of ICs. In embodiments, this information includes physical and operational information, (e.g., pin layouts, redundancy information, timing, voltage ranges, voltage options), power assist information and operational assist information (e.g., voltage and bias selections and conditions) for various types of ICs.

According to aspects of the invention, the configuration library 118 includes respective configuration information for particular ICs. In embodiments, for each bank in an IC under test, the information in the configuration library 118 includes an identifier of the IC, an identifier of each bank in the IC and tuning information corresponding to each bank. For example, the configuration library 118 may include, for each bank in an IC, a bank identifier, a retention voltage value, a bias value, an operating voltage value, a read assist value, a write assist value and a stability assist value.

In embodiments of the invention, the computing device 14 is an application-specific tool capable of executing program code (e.g., the tuning application 105) installed therein. In other embodiments, the computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 12 is only illustrative of various types of computer infrastructures for operating with the invention. For example, in embodiments, the server 12 comprises two or more computing devices (e.g., a server cluster) that communicate over any type of communications link, such as a network, a shared memory, or the like, to perform the process described herein. Further, while performing the processes described herein, one or more computing devices on the server 12 can communicate with one or more other computing devices external to the server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 8:
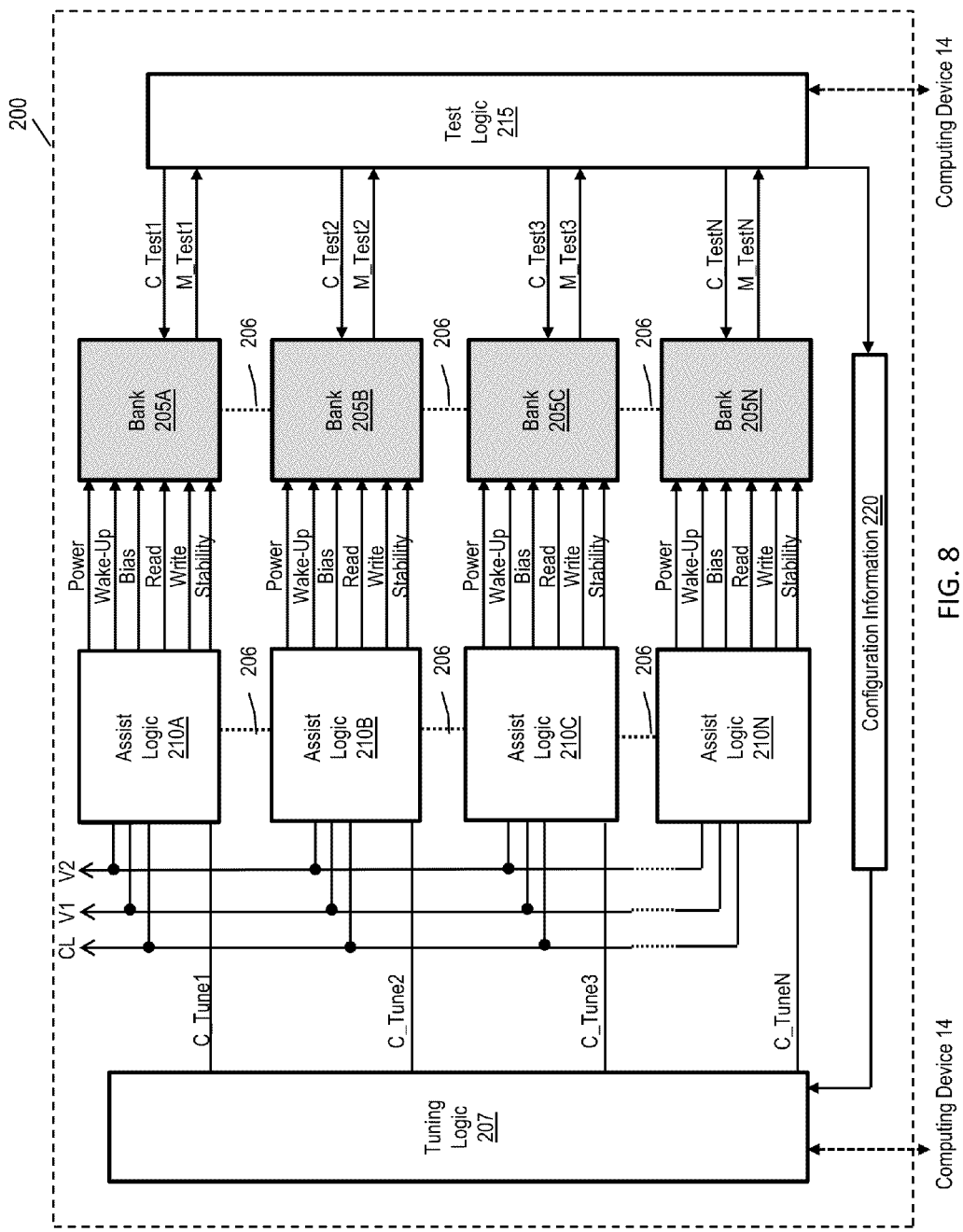
FIG. 8 is an illustration of an exemplary integrated circuit having repeated structures in accordance with aspects of the invention.

FIG. 8 illustrates an exemplary IC 200 including banks 205A, 205B, 205C . . . 205N (collectively "banks 205") comprised of repeated structures in accordance with aspects of the invention. By testing the IC 200 to identify weak cells and selectively tuning each bank to repair the weak cells, the performance of the IC 200 can be increased by avoiding power-consuming assist measures that are not required for robust cells. Additionally, in some embodiments, power-saving assist measures are applied that take advantage of robust cells to improve an IC's performance and/or reduce its power consumption.

The banks 205 are groups of repeated cells, such as memory cells in an SRAM. Each of the banks 205 is connected to tuning logic 207, respective assist logic 210A, 210B, 210C . . . 210N (collectively, assist logic 210), and test logic 215. The tuning logic 207 may cause the respective assist logic 210 corresponding to each of banks 205 to select assist measures for the banks 205. The assist measures include power assists and operational assists. Additionally, in embodiments, the assist measures further include a wake-up assist and a bias assist. It should be understood by those having ordinary skill in the art that the testing logic 207 and the tuning logic 215 may be similar to that which is implemented in modules 106 and 107 of FIG. 7.

According to aspects of the invention, the IC 200 can be divided into a number of banks that maximize an expected number of cells that are robust without power assist. For example, if a 512 KB SRAM is divided into 50 banks of 10K bits, 72% of the banks may require a power assist to protect a 4.0-sigma cell, rather than all banks being provided a power assist to protect a 5.0 plus-sigma cell. In another example, the same 512 KB SRAM can be divided into 16 banks of 32K bits, where 89% of the banks would require a power assist to protect a 4.5-sigma cell. Thus, by optimizing the size of banks in IC, the number of weak banks configured with power assist and/or operational assist can be minimized and, thereby, increase the overall performance of the IC while reducing its power consumption. Further, in embodiments, the number of robust banks tuned with a power-saving assist can be maximized.

In embodiments, IC 200 is manufactured to include banks having a predetermined size. For example, a SRAM may be manufactured with memory cells divided into banks of 512K bits. In other embodiments, the size of banks in IC 200 is selectable after the IC is manufactured. For example, rather than hard-wiring the banks in IC 200, the cells of an SRAM may be dynamically divided into banks of 512K bits by creating divisions 206 using fuses, squibs, switches or the like. In other embodiments, the divisions 206 may be virtually created by mapping the assist logic 210 to groups of cells that are addressed by the tuning logic 207 as a bank 205.

In accordance with aspects of the invention, the tuning logic 207 is any combination of a software program and hardware modules that selectively configures the assist measures corresponding to the banks 205 in IC 200. In embodiments, the tuning logic 207 receives control signals from an external controller (e.g., computing device 14) and, based on configuration information (e.g., configuration library 117), causes the assist logic 210 to select one or more assist measures for a respective bank 205. In embodiments, the tuning logic 207 functions independently of an external device. That is, other than receiving a trigger from an external source, the IC 200 can self-tune the banks 205 using the tuning logic 207. For example, in response to a trigger command (e.g., received from computing device 14), the tuning logic 207 may tune the IC by causing the assist logic 210 to select one or more assist measures based on configuration information 220 generated by the test logic 215.

In accordance with aspects of the invention, the assist logic 210 is any combination of a software program and hardware modules that select one or more assist measures for a corresponding one of banks 205. In embodiments, the assist logic 210 is responsive to commands C_Tune1 to C_TuneN from the tuning logic 207 to select one or more assist measures that are provided to its corresponding bank 205. The assist logic 210 may be comprised of selectable logic that varies a source voltage (e.g., V1 and V2) supplied to the bank. Additionally, the assist logic 210 may be comprised of selectable logic that selects or varies a timing signal (e.g., CL) supplied to the bank. For example, the voltage and/or timing sources may be connected to a bank using a switch, gate logic, and/or a non-volatile memory. Alternatively, the switching logic may be permanent switching logic, such as a squib or fuse, which disconnects an assist measure from one voltage source while leaving another intact. It should be understood by those having ordinary skill in the art that the assist logic 210 may be similar to that which is illustrated in FIGS. 4 and 5.

For example, a tuning command C_Tune1 may cause the assist logic 210A to blow a fuse that disconnects one or more voltage sources (e.g., V1 or V2) from a bank 205 and leaves a selected voltage source (e.g., V2) connected to the bank 205 to provide power assist voltage to the bank 205. Notably, FIG. 8 illustrates only two voltage sources connected to each assist logic unit 210 for simplicity. Embodiments may have two or more voltage sources corresponding to each type of assist measure that is selectable by the tuning logic 207. Likewise, FIG. 8 illustrates only one clock signal CL that is varied based on the tuning logic 207. Embodiments may have two or more clocks signals that are selectable by the tuning logic and/or variable by the assist logic 210. Further, FIG. 8 illustrates assist logic as including all the assist functionality in a single unit. In embodiments, one or more of the assist measures are provided in separate units.

In embodiments, the assist measures include power assists and operational assists. Embodiments may additionally include a wake-up assist and/or a bias assist. The power assists selectively provide one of a plurality of supply voltage (e.g., VDD) to cells within a bank. For example, selecting a higher supply voltage for a cell that is weak (e.g., ≤4.5 sigma) for readability, writability, and/or stability of the weak cell and can eliminate the weakness. However, selecting a higher supply voltage for a less weak cell (e.g., >4.5 sigma) may provide little or no benefit and, as such, unnecessarily consume power. Hence, according to aspects of the invention, power is conserved by selecting power assist for banks including weak cells.

Read assist is a type of operational assist measure that may be selectively applied to provide more reliable reading of information from cells in a corresponding bank. When a cell is weak for readability, timing and/or voltage issues may make the cell unreliable or impossible to read data from the cell. A cell's weakness for readability may be determined by iteratively writing known values to the cell, attempting to read the values under different conditions, and identifying the errors, and determining the number of errors. Read assist can reduce or eliminate this weakness by increasing the time frame during which data may be read from cells.

Write assist is a type of operational assist measure that may be selectively applied to provide more reliable writing of information to cells in a corresponding bank. When a cell is weak for writability, timing, and/or voltage issues can make the cell unreliable or impossible to over-write the existing data. A cell's weakness for writability may be determined by iteratively writing known values to the cell under different conditions and determining the number of errors. Write assist can repair this weakness by selectively providing an increased voltage to the write logic. For example, in an SRAM, write assist increases the pass-gate voltage supplied when information is written to cells.

Stability assist is a type of operational assist measure that may be selectively applied to provide more reliable retention of information in cells in a corresponding bank. When a cell is weak for stability, data stored in a cell may change (e.g., flip from a binary value of "0" to "1," or vice versa). A cell's weakness for stability may be determined by iteratively writing known values to the cell under different conditions and identifying any change in the written value after a period of time. For example, in an SRAM, stability assist may assist a cell in maintaining data while the cell is being read by lowering a bit-line (BL) voltage used to read data from the cell.

Wake-up assist is a power-saving assist measure that selectively provides an additional voltage to a bank when the IC cell transitions from a retention state to an active state. When not active, cells tend to leak voltage. For example, a memory cell that was recently read from or written is active and, owing to the voltages applied to the read or write lines, will have pass-gate (PG) voltages used for reading and writing to the cells at a collector supply voltage ($V_{CS}$), which is above a supply voltage (e.g., $V_{DD}$). However, when the memory cell has been inactive for a period, the PG voltage will decrease over time. Subsequently, when the inactive memory cell transitions back to an active state, a wake-up assist (i.e., "wake-up") voltage may be applied to raise the PG voltage toward $V_{CS}$ to improve reliability when reading or writing to the cell. Without wake-up assist, a weak cell may unreliably read and/or write data. However, a robust cell may perform reliably without wake-up assist. Thus, power may be conserved by providing wake-up assist on a bank-specific basis (i.e., a light sleep mode), such that a bank containing all robust cells does not receive wake-up assist before the bank is accessed. For example, if bank 205A has no weak cells (i.e., a robust bank) it can be individually tuned without wake-up assist, reducing power consumed by the wake-up voltage, as well as leakage.

Bias assist is a power-saving assist measure that selectively places a bias on the drains of transistors in the cells within the bank 205. By biasing the cells, their leakage voltage can be reduced to reduce IC 200's power consumption. However, biasing the drains can reduce the reliability of cells by reducing their margin for error. As such, bias assist may cause readability, writability, and/or stability errors in weak cells. Robust cells, however, may not be impacted by the bias. Accordingly, the tuning logic 207 may cause the assist logic 220 to selectively provide bias assist to banks 205 having weak cells, while banks 205 including weak cells are not selected for bias assist.

The embodiment shown in FIG. 8 is simplified for the sake of illustration. For example, the IC 200 is discussed in terms of weak cells and robust cells. However, cells are not limited to two classes. Embodiments may have three or more classes of cells that have different probabilities of failures (e.g., <4.0 sigma, 4.0 sigma to 5.0 sigma, and >5.0 sigma) and different combinations of assist types may be applied to different classes of cells. For example, in embodiments, the most robust cells (e.g., <4.0 sigma) may not require any assist features; the moderately-robust cells (e.g., 4.0 sigma to 5.0 sigma) may be selected only for power assist, but no wake-up assist and no bias assist; and the weak cells (e.g., >5.0 sigma) are selected for power assist, wake-up assist, bias assist and one or more of read, write, and stability assist.

According to aspects of the invention, the test logic 215 determines operational failures in cells within the IC 200. In embodiments, failures include write failures, read failures, and stability failures. For example, where the IC 200 is a SRAM, the test logic 215 iteratively writes and reads various patterns of data to the cells under different conditions (e.g., speed, timing, voltage, temperature, vibration, etc.), determines whether there are any errors, determine the type of error, and logs information describing error in correspondence with an identifier of the bank in which the cell resides. Each type of error may be associated with an expected rate failure based on the frequency and/or conditions under which the error occurs with respect to the other cells.

In embodiments, the test logic 215 receives test signals from an external controller (e.g., computing device 14) based on IC information (e.g., IC library 117) that causes the tuning logic to provide test information (e.g., C_Test1, C_Test2, C, C_Test2, C . . . C_TestN) and receive test results (e.g., M_Test1, M_Test2, M, M_Test2, M . . . M_TestN) through which weak cells in the banks 205 are determined. For example, an IC may receive test information (e.g., algorithms and controls) from computing device 14 via standardized interface pins (e.g., JTAG pins). In other embodiments, the test logic 215 generates test information C_Test1, C_Test2, C, C_Test2, C . . . C_TestN for testing the IC without input from an external controller (e.g., computing device 14). For example, the test logic 215 may be a BIST. In order to generate test algorithms, the BIST logic may be stored locally in the test logic 215 and generate different test data pattern generation, looping schemes, and perform data comparison.

FIG. 9 illustrates exemplary configuration information for a particular, exemplary IC (e.g., IC 200). According to aspects of the invention, test logic (e.g., test module 106 and/or test logic 215) determines the configuration information and logs the information in the table 300 based on the result of testing (or re-testing) the IC. In embodiments, the configuration information is stored in, for example, configuration library 118 and/or configuration information 220.

More specifically, as shown in FIG. 9, table 300 includes the following columns: bank identification 301, power assist 302, wake-up assist 303, bias assist 304, read assist 305, write assist 306, and stability assist 307. The bank ID column 301 includes entries identifying each bank in the IC (e.g., banks 205A, 205B, 205C . . . 205N). The power assist column 302 includes a value corresponding to each bank identified in column 301 that causes the tuning logic to select one of several power assists (i.e., operating voltages) of the corresponding bank. The wake-up assist column 303 includes a value that causes the tuning logic to select wake-up assist for a corresponding bank. The bias column 304 includes a value for each IC that causes the tuning logic to bias for the corresponding bank. Columns 305-307 include values that cause the tuning logic (e.g., tuning module 107 and/or tuning logic 207) to select one or more of read assist, write assist or stability assist for the corresponding bank.

The values in columns 302-307 may be determined by testing the IC (e.g., by test module 107 and/or test logic 220). For example, testing may indicate that bank 205A does not include any weak cells. In other words, after testing of the IC, no cells in bank 205A were determined to be weak. In such case, the bank would not include any operational assists and, accordingly, the value "zero" (0) would be stored in the columns 305-307 corresponding to operational assists (i.e., read assist, write assist, and stability assist) for bank 205A. Further, in embodiments, banks that have no weak cells are considered robust. Thus, for example, the test logic may record a value indicating that no wake-up assist is required and/or a bias assist is applied to the cells of the robust bank 205A. By doing so, bank 205a is tuned to reduce voltage consumption by not applying power to place the cell in an active mode after is has been idle, as well as leaking less voltage.

In contrast, when the test logic determines that bank 205B includes a cell that failed a read test, the bank 205B may be repaired by selecting a read assist for the bank. Accordingly, a value indicating the selection of read assist may be stored in the corresponding column of table 300. For example, a value (e.g., "1") indicating that read assist can be recorded in the table 300. Further, since the bank has been determined to have a weak cell, in embodiments, power savings measures would not be applied, including eliminating retention voltage or adding a bias voltage. Accordingly, a value of zero may be recorded in columns 303 and 304 corresponding to bank 205B.

Further, in some cases, a bank including a weak cell cannot be repaired by providing a type of operational assist. For example, after selecting stability assist for bank 205C and retesting the IC, a cell may still be determined to be weak. In such case, the test logic may record a value in column 302 corresponding to bank 205C that causes tuning logic to select power assist for the bank. Notably, although FIG. 9 only illustrates two voltages V1 and V2 for simplicity, as indicated in column 302, the IC may provide three of more numbers of increasing power assists that may be selected by the tuning logic. For example, column 302 corresponding to bank 205C shows an operating power assist of 3 (i.e., binary 1-1") indicating selection of a third voltage assist for the corresponding bank 205C.

As can be seen from FIG. 9, ICs may be tuned to provide enhanced production yields by providing power and/or operational assist to weak cells while conserving power provided to strong cells on a per-bank basis. Moreover, robust banks can be tuned to provide power-savings assists that further reduce the power consumption of ICs, while maintaining their reliability.

Figure 10:
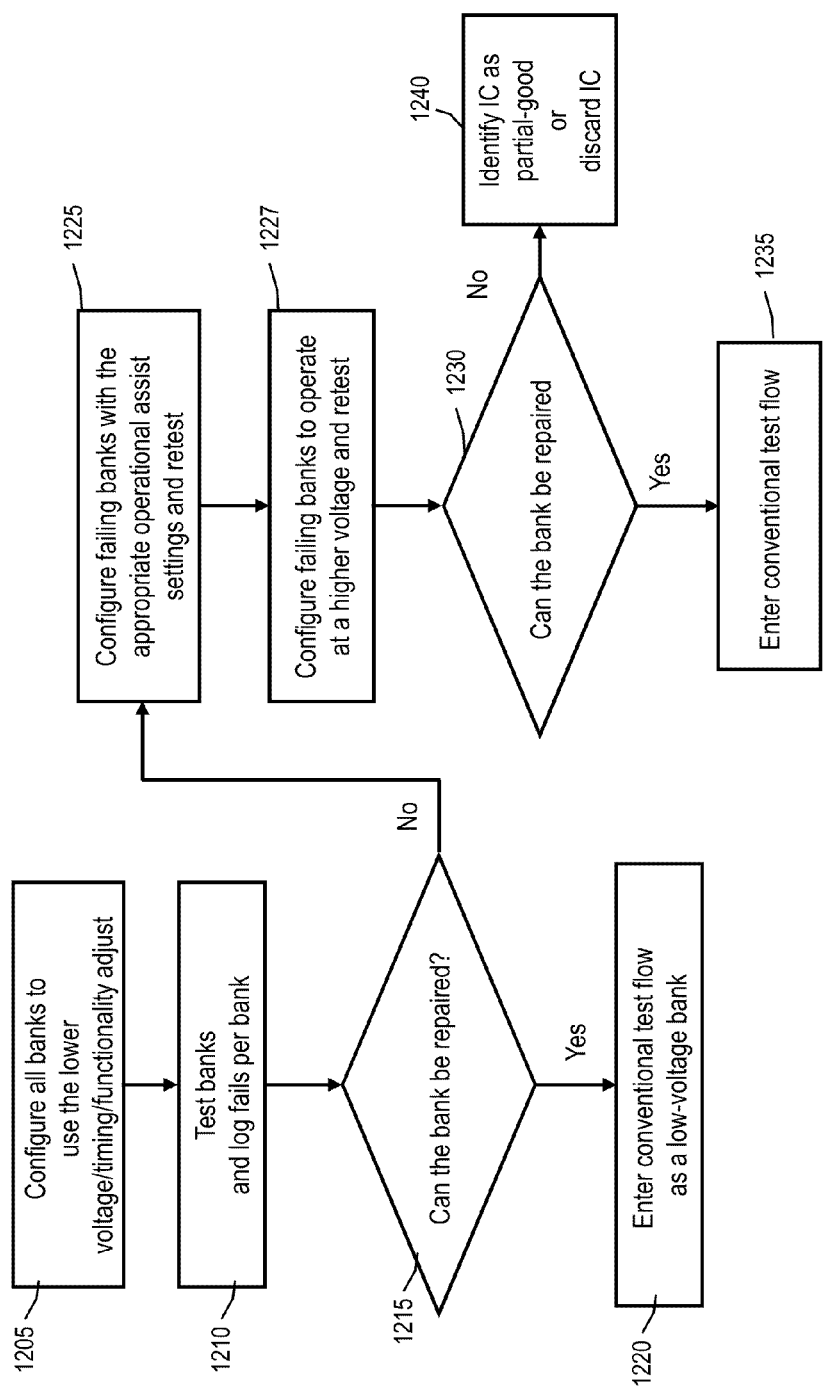
FIG. 10 shows a flow diagram of an exemplary process usable to tune an IC circuit having repeated structures in accordance with aspects of the invention.
Figure 11:
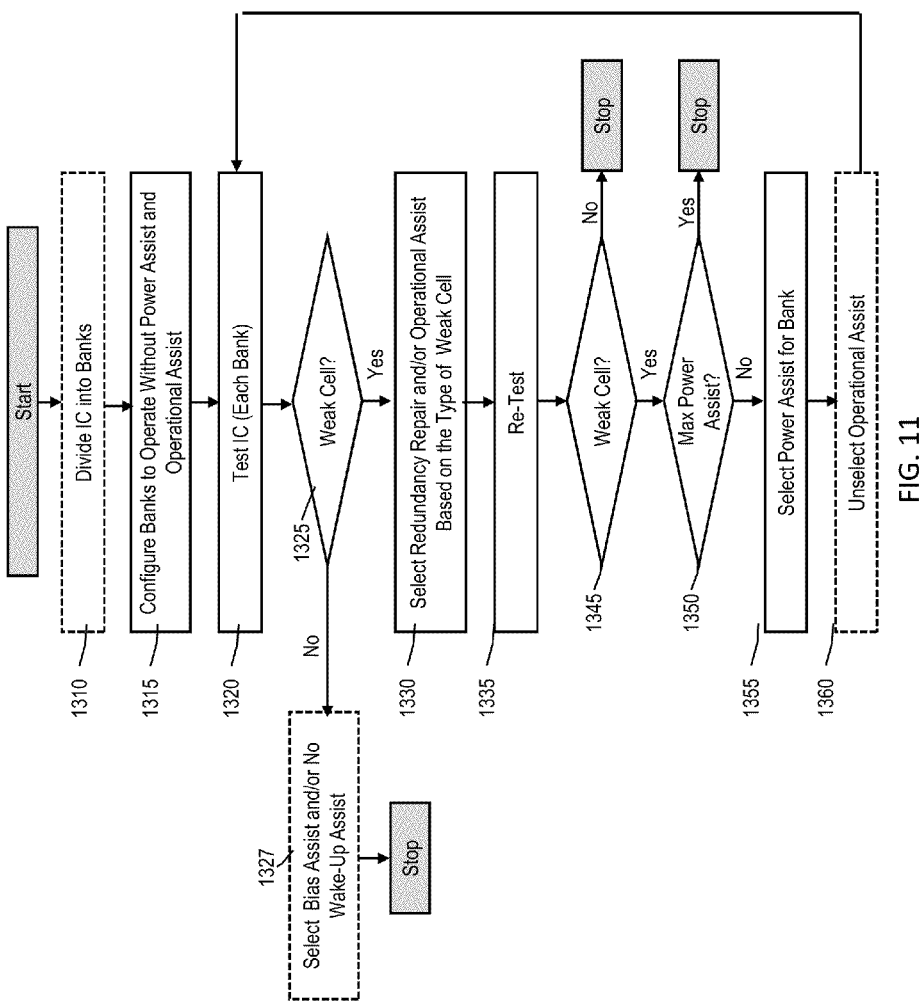
FIG. 11 shows a flow diagram of an exemplary process usable to tune an IC circuit having repeated structures in accordance with aspects of the invention.

FIGS. 10 and 11 show exemplary process flows for performing aspects of the present invention. The steps of FIGS. 10 and 11 may be implemented in the environment of FIG. 7. The flowcharts in FIGS. 10 and 11 illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environments of FIG. 7. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

FIG. 10 illustrates a flow diagram of an exemplary process usable to repair and tune an IC having repeated structures. According to aspects of the invention, the process may selectively tune assist logic (e.g., assist logic 210) corresponding to each bank of an IC to improve manufacturing yields and reduce power consumption. The cells of the IC are divided into banks (e.g., banks 205), each of which is mapped to corresponding assist logic (e.g., assist logic 210). In embodiments, the divisions (e.g., divisions 206) between banks may be predetermined based on the structure of the IC. For example, the IC design may physically divided cells of a memory device into banks.

At the start of the process illustrated in FIG. 11, an IC (e.g., IC 200) including repeated structures (e.g., cells of an SRAM) is powered and ready to test. For example, the IC may be placed in a slot of a test bench (e.g., computing device 14) that provides power and interfaces with the IC. According to aspects of the invention, the tuning of the IC can be controlled by control logic. In embodiments, the tuning is controlled by an external computing device (e.g., computing device 14 executing tuning application 105). In other embodiments, the tuning can be controlled by an internal computing device (e.g., tuning logic 207).

At step 1205, the IC is initially configured with all banks to use minimal tuning adjustments. That is, the cells are configured to operate without any assist measures. In embodiments, the banks of the IC are configured without power assist, operational assist, wake-up assist and bias assist. For example, when the control logic is triggered to initiate tuning of an IC, the control logic may initialize all the values recorded in the IC's configuration information (e.g., table 300) to zero.

At step 1210, the test logic will test the banks and log failures per bank. The test may include writing and reading test patterns to the IC under different operational conditions and determining whether any errors occur with respect to the operational characteristics of the IC (i.e., readability, writability, and/or stability). In embodiments, test logic is external to the IC (e.g., test module 106). In other embodiments, the test logic is built-in test logic (e.g., test logic 215). For example, test logic may determine the banks in the IC that include one or more cells having a likelihood of failure for one or more operational characteristic above threshold value.

At step 1215, test logic determines whether a failed bank can be repaired. Repairing may include activating redundant cells and/or redundant lines (e.g., redundant SRAM rows and columns, as well as supply voltage or bit lines) in place of damaged cells, lines and/or using operational assist measures. When the test logic determines that repairing is successful, at step 1220, the IC may enter the conventional test flow configured to operate at a low supply voltage (i.e., not configured to operate using a higher power-assist voltage).

When the test logic determines that repairing failed, at step 1225, the tuning logic configures the failing banks to operate with the appropriate operational assist setting corresponding to the failure and retests. For example, if testing the IC determines that a particular bank includes one or more cells that are weak for readability, the tuning logic can configure the bank with read assist and retest the IC. When the test logic determines that the configuring with operational assist setting is successful, the IC may enter the conventional test flow configured with the operational assist setting at step 1235.

At step 1227, when the test logic determines that the configuring with operational assist setting is not successful, the tuning logic configures the failing banks to operate at a higher voltage and retests. That is, the tuning logic configures the failed banks with power assist. When the test logic determines that the configuring with higher voltage is successful, the IC may enter the conventional test flow configured with the operational assist setting and power assist setting at step 1235.

At step 1230, based on the results of the retest, the test logic determines whether any remaining failed banks can be repaired. Here, again, the repairing may include using redundant cells, lines and/or using operation assist measures. When the repairing is successful, at step 1235, the IC may enter the conventional test flow with some of its banks configured to operate at a higher supply voltage. In embodiments, the configurations are permanently configured by fusing the selected tuning. Otherwise, if any of the failed banks cannot be repaired, at step 1240, the IC can be identified for partial-good use or discarded.

FIG. 11 shows a flow diagram of an exemplary process usable to tune individual banks of repeated structures in an IC. According to aspects of the invention, the process may selectively tune assist logic (e.g., assist logic 210) corresponding to each bank of an IC to improve manufacturing yields and reduce power consumption. At the start of the process, an IC (e.g., IC 200) including repeated structures (e.g., cells of an SRAM) is powered and ready to test. For example, the IC may be placed in a slot of a test bench (e.g., computing device 14) that provides power and interfaces with the IC. According to aspects of the invention, the tuning of the IC is controlled by control logic. In embodiments, the tuning can be controlled by an external computing device (e.g., computing device 14 executing tuning application 105). In other embodiments, the tuning can be controlled by an internal computing device (e.g., tuning logic 207).

At step 1310, the cells of the IC are divided into banks (e.g., banks 205), each of which is mapped to corresponding assist logic (e.g., assist logic 210). In embodiments, the divisions (e.g., divisions 206) between banks may be predetermined based on the structure of the IC. For example, the IC design may physically divide cells of a memory device into banks. In other embodiments, the IC may be divided into banks at the time of testing. That is, the control logic may reference predetermined information (e.g., the IC library 117) corresponding to the IC under test that specifies how the cells of the IC should be divided into banks. The divisions may be customized to a particular type of IC or batch of IC's. For example, in ICs determined to have a greater error rate, a design engineer may modify the corresponding information in the IC library to cause the control logic to divide the cells into smaller banks, and, thereby decrease the probability that any particular bank includes a weak cell.

At step 1315, the IC is configured to operate without any assist measures. In other words, the banks of the IC are configured without power assist, operational assist, wake-up assist, and bias assist. For example, when the control logic is triggered to initiate tuning of an IC, the control logic may initialize all the values recorded in the IC's configuration information (e.g., table 300) to zero. In this initial configuration, banks of the IC that include weak cells may be identified along with the cells' corresponding type of weakness (e.g., read, write, stability).

At step 1320, the test logic tests the IC. The test may include writing and reading test patterns to the IC under different operational conditions and determining whether any errors occur with respect to the operational characteristics of the IC (i.e., readability, writability, and/or stability). At step 1325, the test logic determines whether any cells failed the test. A cell may be considered to have failed when the number of errors for an operational characteristic exceeds a predetermined threshold. Failures include read, write and stability error rates that exceed a threshold above a nominal (e.g., average cell). For example, a passing 3-sigma bank for readability may have no more than thirteen read errors per ten thousand cells (i.e., 13/10,000); whereas, a passing 4-sigma bank for readability may have no more than thirty two read errors per million cells (i.e., 32/1,000,000).

When the control logic determines that a particular bank in the IC does not include any failed cells in the initial test (i.e., step 1325, "No"), then the control logic determines that no power assist and no operational assist (i.e., no read assist, write assist, or stability assist) is required. In embodiments, the control logic may cause the tuning logic to configure the bank without power assist or operational assist by recording zero values in the IC's configuration information for the entries (e.g., power assist column 302, read assist column 305, write assist column 306 and stability assist column 307) corresponding to the bank.

In embodiments, at step 1327, the control logic may additionally cause the tuning logic to configure banks having no failed cells (i.e., robust banks) to operate without wake-up assist and/or with bias assist. The determination of whether to tune the IC to provide one or both of the wake-up assist and the bias assist may be based on the robustness of the cells in a bank. That is, when the bank is populated by robust cells then both wake-up assist and the bias assist don't need to be applied. When the bank includes a less robust cell (e.g., 4.0-sigma to 5.0-sigma), then only one of wake-up assist and the bias assist may be applied. However, when the test logic determines that bank 205A includes cells that require both bias assist and wake-up assist then, the test module or the test logic may record a value (e.g., "1") in the wake-up assist column 303 and/or the bias assist column 304 of table 300 corresponding to the identifier of bank 205A in bank ID column 301.

At step 1330, when the initial testing determines that a cell in a particular bank is weak (i.e., step 425, "Yes"), then the control logic configures the bank to use one or more types of operational assist (i.e., read assist, write assist, or stability assist). Additionally or alternatively, the control logic can select redundancy repair based on the type of weak cell. In embodiments, the control logic configures the bank by causing tuning logic (e.g., via tuning logic 207 and assist logic 210) to select an operational assist by recording a corresponding value in the IC's configuration information at step 1320 for one or more entries (e.g., read assist column 305, write assist column 306 and stability assist column 307) corresponding to the bank. For example, if bank 205B includes a cell that is weak for readability, the control logic may record a value (e.g., "1") in the read assist column 305 of table 300 corresponding to the identifier of bank in bank ID column 301.

At step 1335, the control logic re-tests the IC, including the operational assist measure configured at step 1330. As described with respect to step 1320, the test may include writing and reading various test patterns to the IC under different operational conditions and determining whether any cells are weak occur with respect to reading the data, writing the data or holding the data.

At step 1345, the control logic determines whether the re-test performed in step 1340 identified banks that have weak cells and the type of weakness. When it is determined that no cells failed the retest (i.e., step 1345, "No"), the process may stop. For example, when tuning the banks of the IC repairs the weak cells, the IC may enter a subsequent test flow with tuned assist configuration fused.

When it is determined that a bank includes a weak cell, at step 1350 (i.e., step 1345, "Yes"), the control logic determines whether that bank is tuned for the maximum available power assist voltage As described at step 1315, the IC is initially tuned to operate without power assist, (i.e., minimum voltage, V1). Hence, when the bank is tuned to operate at V1, then the bank is not at maximum power assist.

When it is determined that bank is tuned for the maximum power assist at step 1350, then the process stops. In this event, because the IC has errors in at least one bank that are not repairable, the process stops.

When it is determined that the bank is not tuned for the maximum available power assist voltage (e.g., V2) at step 1350, then the control logic tunes the IC to operate at a higher operational power assist at step 1355. For example, if a bank includes a cell that failed the re-test in step 1345, despite being tuned with an operational assist in step 1330, the control logic may add an incremental value (e.g., "1") in the power assist column 302 of table 300 corresponding to the identifier of bank (e.g., bank 205C) in bank ID column 301. In some cases, such as shown in FIG. 2, the IC may only include two voltage sources to provide power assist. In these cases, the value in the power assist column 302 may be single value indicating the selection of one power source or the other. In cases where an IC provides three or more power sources, the control logic may incrementally increase the value in column 302 to iteratively increase the power assist to a maximum amount.

After tuning the power assist for the banks of an IC, the process returns to step 1320 in which the IC is tested to determine whether there are failures in any of the banks. In embodiments, at step 1360, prior to beginning a new iteration, the control logic resets the operational assist to remove any read, write or stability assist measures configured at step 1330. Since the power assist can potentially repair the weak bank regardless of the operational assist, unselecting any operational assists when configuring a power assist may conserve power that might be unnecessarily spent on the operation assists. In embodiments, the assist measures configured at step 1330 are left in place when configuring the power assist.

As set for the above, embodiments of the invention selectively tune individual banks of cell to reduce failures while allowing less overdesign. For example, stability, writability and readability all improve with higher voltage. However, by increased voltage in all cells in an IC, power leakage is made significantly worse. By increasing the voltage to certain banks, a significant power saving may be achieved. The invention further allows a secondary dynamic/leakage power reduction by reducing the overdesign (e.g., for readability, writability and stability). Further, using multiple voltage domains and array partitioning achieves granular control of power-savings and other performance improvements.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method for repairing and tuning an integrated circuit comprising:
    determining that a first bank of a plurality of banks of repeated structures in the integrated circuit includes a failure;
    determining that the failure of the first bank cannot be repaired; and
    configuring the first bank with an operational assist corresponding to the failure.

2. The method of claim 1, further comprising:
    determining that the first bank configured with the operational assist includes the failure or another failure; and
    configuring the first bank with a voltage assist.

3. The method of claim 2, further comprising determining that the first bank configured with the operational assist and the voltage assist can be repaired.

4. The method of claim 1, wherein the determining that the first bank of the plurality of banks includes the failure comprises:
    configuring the plurality of banks with minimum tuning adjustments; and
    testing the plurality of banks; and
    determine the first bank includes one or more cells having a likelihood of failure for one or more operational characteristics that is above a threshold value.

5. The method of claim 4, wherein the configuring the plurality of banks with minimum tuning adjustments comprises configuring the plurality of banks without any power assist and without any operational assist.

6. The method of claim 5, wherein the testing the plurality of banks comprises:
    reading and writing test patterns to the integrated circuit; and
    determining that an error has occurred with respect one or more of readability, writability, and stability.

7. The method of claim 1, wherein the configuring the first bank with the operational assist comprises selecting the operational assist from a plurality of operational assists based on a type of the failure.

8. The method of claim 1, wherein the determining that the first bank cannot be repaired comprises determining that a failed cell or a failed line cannot be replaced by a redundant cell or a redundant line, respectively.

9. The method of claim 1, further comprising sizing the plurality of banks to maximize an expected number of banks that are robust.

10. A computer program product comprising a computer readable storage medium having a computer readable program code stored on the computer readable storage medium, wherein the computer readable program code, when executed on a computing device, is operable to cause the computing device to:
    configure banks of a repeated structure integrated circuit without any power assist and without any operational assist provided by assist logic respectively corresponding to the banks;
    determine that a plurality of the banks include weak cells;
    determine that the plurality of the banks including the weak cells cannot be repaired; and
    configure the assist logic corresponding to the plurality of the banks.

11. The computer program product of claim 10, wherein the configuring the assist logic corresponding to the plurality of the banks comprises configuring respective operational assists of the plurality of the banks, the respective operational assists corresponding to types of the weak cells included in the plurality of the banks.

12. The computer program product of claim 11, wherein the operational assists include one or more of a read assist, a write assist, and a stability assist.

13. The computer program product of claim 11, wherein the configuring respective operational assist of the plurality of the banks comprises configuring respective voltage assists of the plurality of banks.

14. The computer program product of claim 13, wherein voltage assists comprise increased supply voltages.

15. The computer program product of claim 10, wherein the computer readable program, when executed on the computing device, is further operable to cause the computing device to determine whether the plurality of the banks configured with the assist logic can be repaired.

16. The computer program product of claim 10, wherein the computer readable program, when executed on the computing device, is further operable to divide the integrated circuit into the banks, wherein the size of the banks maximizes an expected number of the banks that do not include weak cells.

17. The computer program product of claim 10, wherein the computer usable storage device having the computer readable program and the computing device are included in the integrated circuit.

18. An integrated circuit comprising:
    a plurality of banks including a plurality of repeated cells;
    assist logic respectively corresponding to the plurality of banks; and
    test logic configured to determine whether one or more of the plurality of repeated cells have operational weaknesses; and
    tuning logic configured to:
        determine whether the one or more of the plurality of repeated cells determined by the test logic to have operational weaknesses can be repaired; and
        selectively configure the corresponding assist logic of the plurality of banks including the one or more of the repeated cells, wherein the configuring the assist logic corresponding to the plurality of the banks comprises configuring respective operational assists of the plurality of the banks, the respective operational assists corresponding to types of the weak cells included in the plurality of the banks, and the operational assists include one or more of a read assist, a write assist, and a stability assist.

19. The integrated circuit of claim 18, wherein the configuring the assist logic comprises configuring operational assist logic and voltage assist logic.

20. The integrated circuit of claim 19, wherein the tuning logic is further configured to:
    determine whether the plurality of banks selectively configured with the operational assist logic and the voltage assist logic have operational weaknesses; and determine whether the plurality of banks selectively configured with the operational assist logic and the voltage assist logic can be repaired.

* * * * *